United States Patent
McKernan et al.

(10) Patent No.: US 9,455,036 B1
(45) Date of Patent: Sep. 27, 2016

(54) SYSTEM ARCHITECTURES WITH DATA TRANSFER PATHS BETWEEN DIFFERENT MEMORY TYPES

(71) Applicant: Adesto Technologies Corporation, Sunnyvale, CA (US)

(72) Inventors: Ed McKernan, West Lake Hills, TX (US); Malcolm Wing, Palo Alto, CA (US); Ravi Sunkavalli, Cupertino, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 14/868,363

(22) Filed: Sep. 28, 2015

Related U.S. Application Data

(63) Continuation of application No. 13/846,539, filed on Mar. 18, 2013, now Pat. No. 9,147,464.

(60) Provisional application No. 61/647,064, filed on May 15, 2012.

(51) Int. Cl.
   *G11C 11/34* (2006.01)
   *G11C 14/00* (2006.01)
   *G11C 13/00* (2006.01)
   *G11C 11/408* (2006.01)

(52) U.S. Cl.
   CPC ......... *G11C 14/0045* (2013.01); *G11C 11/408* (2013.01); *G11C 13/0011* (2013.01); *G11C 13/0023* (2013.01); *G11C 13/0069* (2013.01)

(58) Field of Classification Search
   CPC .............................. G11C 7/10; G11C 7/1045
   USPC .................. 365/185.08, 189.17, 189.18, 148
   See application file for complete search history.

(56) References Cited

U.S. PATENT DOCUMENTS

| | | | |
|---|---|---|---|
| 9,147,464 B1 | 9/2015 | McKernan et al. | |
| 2001/0053090 A1* | 12/2001 | Takata | G11C 11/005 365/185.08 |
| 2010/0110748 A1* | 5/2010 | Best | G06F 12/0638 365/51 |
| 2012/0079175 A1* | 3/2012 | Flynn | G11C 7/1012 711/103 |
| 2015/0278104 A1* | 10/2015 | Moon | G06F 3/0611 711/135 |

OTHER PUBLICATIONS

U.S. Appl. No. 13/846,539, filed Mar. 18, 2013, parent of the present application.

* cited by examiner

*Primary Examiner* — Han Yang

(57) ABSTRACT

A system can include a first memory section comprising a plurality of volatile memory cells; a second memory section comprising a plurality of nonvolatile memory cells; a first data path configured to transfer data between the first and second memory sections; an interface circuit coupled to receive access commands and address values, the interface circuit configured to determine if a data transfer operation is occurring in the device, and if the data transfer operation is occurring, accessing the address in the first memory section or accessing a location in the second memory section based on a select value, and if the data transfer operation is not occurring, accessing the address in the first memory section; and a compare circuit configured to compare a received address to a predetermined value to generate the select value.

17 Claims, 13 Drawing Sheets

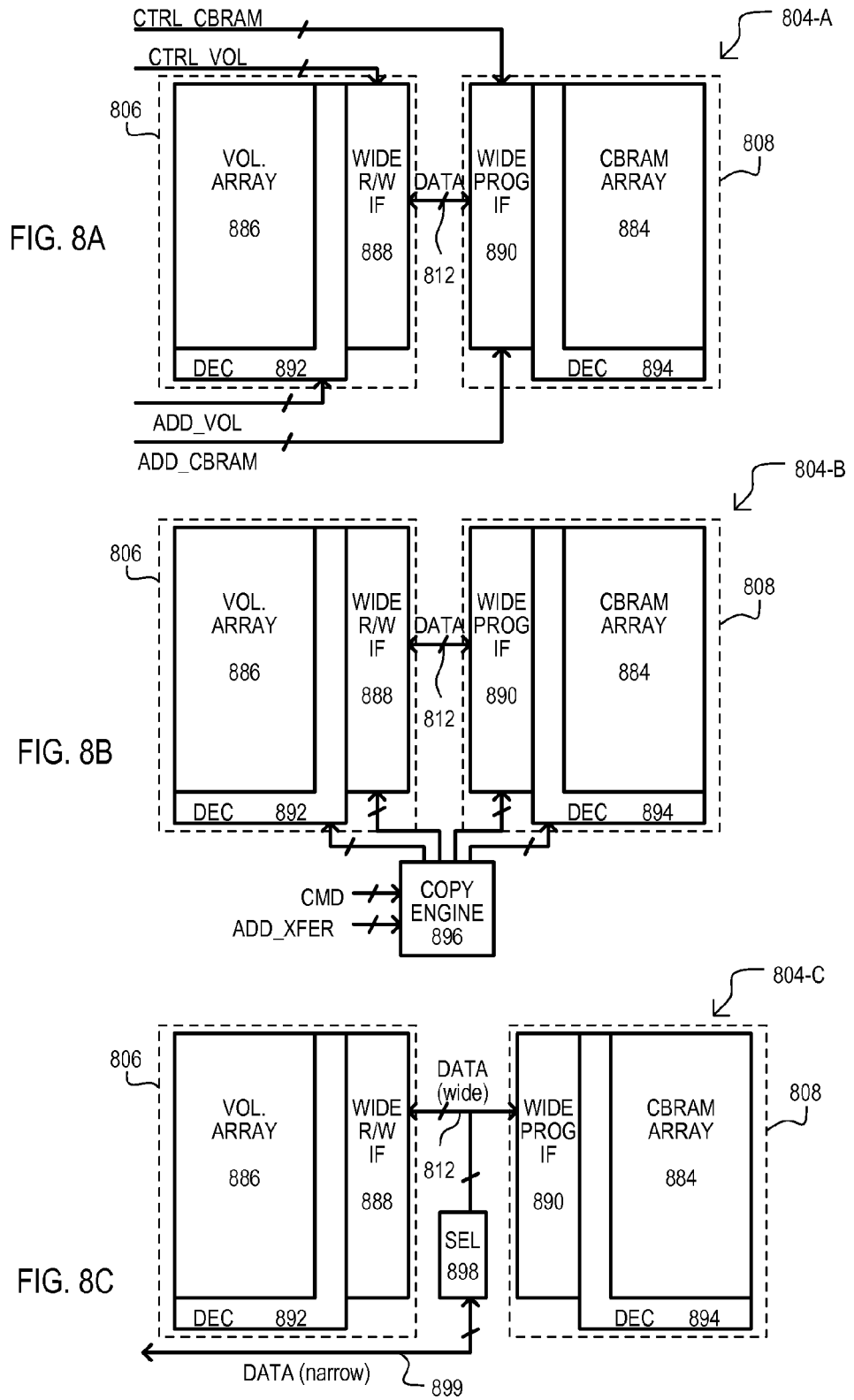

"ZERO" DELAY RESTORE - INITIAL

"ZERO" DELAY RESTORE - IN PROGRESS

"ZERO" DELAY RESTORE -
READ - ADD < CURR_PTR (BACKGROUND)

SYSTEM ARCHITECTURES WITH DATA TRANSFER PATHS BETWEEN DIFFERENT MEMORY TYPES

This application is a continuation of U.S. patent application Ser. No. 13/846,539 filed on Mar. 18, 2013, which claims the benefit of U.S. provisional patent application Ser. No. 61/647,064, filed on May 15, 2012, the contents both of which are incorporated by reference herein.

TECHNICAL FIELD

The present disclosure relates generally to electronic systems, and more particularly to systems that include a volatile memory section for fast memory accesses and a nonvolatile section for saving data in the absence of power.

BACKGROUND

Conventional system architectures for low power operations can incorporate both a dynamic random access memory (DRAM) and Flash (Flash Electrically Programmable and Eraseable Read Only Memory) memory as part of the memory hierarchy. Standby power can be reduced by powering off the DRAM. However, DRAM is a volatile memory that loses its data in the absence of power. Thus, if DRAM data is needed when the system starts up again, such data is stored in the Flash memory. Copying data from DRAM to Flash memory when entering a standby mode, and reading data back from the Flash memory into DRAM when entering active mode, adds to system power and latency.

In many conventional mobile systems, energy is saved by removing power from various subsystems when possible. However, to ensure continuity of operation, user states must first be saved in a subsystem that remains powered or in a nonvolatile memory, such as Flash memory. For example in a laptop computer, a "suspend to ram" operation saves all processor states in memory, then powers off the processor. The memory remains powered. When resuming, the processor is powered up and the state restored. In a "suspend to disk" operation, the system state is saved to disk, and then the majority of the platform can be powered down. In small mobile devices, such as smart phones and tablets, nonvolatile memory serves a function like that of the disk in a laptop computer.

The speed with which these save/restore functions can be performed, and the energy cost of the save/restore functions themselves, can affect the energy saving benefits of the system. In general, the save/restore functions must be both fast and low energy. When this is achieved, energy savings can result from performing save/restore more frequently, equivalently, more aggressively. In conventional smart phones and tablet computing devices the path used by the save/restore function goes through a system-on-chip (SoC) device, and is often performed in software. In addition, in such conventional systems, DRAM and Flash have relatively low bandwidth paths to the SoC.

Conventional memory systems are known that pair static random access memory (SRAM) cells with silicon-oxide-nitride-oxide-silicon (SONOS) type storage elements. Such memory systems can perform a bit-to-bit copy of SRAM data to SONOS elements. However, a drawback to SONOS technology can be the relatively high voltages needed to program SONOS elements. This can present process integration challenges, and require more power, as power is proportional to voltage squared. In addition, the one-to-one pairing of SRAM cells to SONOS elements results in a hardwired configuration between the SRAM storage space and the SONOS storage space. That is, such systems do not have any flexibility to configure which areas will be saved/restored and which areas will not.

FIG. 18 shows a conventional system 1800 that can be included in a smart phone or tablet computing device. A conventional system 1800 can include an SoC 1801, a DRAM section 1805, and Flash memory section 1803. DRAM and Flash memory sections (1805, 1803) can have separate data paths to the SoC 1801. In FIG. 18, a data path 1807-0 between Flash memory 1803 and SoC 1801 can be 32-bits wide, while a data path 1807-1 between DRAM 1805 and SoC 1801 can be 32- or 64-bits wide. In order to remove power from the SoC 1801, the state of the SoC 1801 and the data stored by the DRAM section 1805 must be saved. A conventional system 1800 can execute a save operation in one of two ways. Either power is maintained to the DRAM at all times or the relevant DRAM state is copied to the Flash memory before removing power from the DRAM. Such a copy operation can be quite slow due to the nature of Flash memory (erasure of one or more sectors followed by programming of data) and the need to move the data through the SoC 1801.

In a restore operation, data can be transferred, via SoC, from Flash memory 1803 to DRAM 1805. Until the restore operation is complete, other operations by system 1800 may not be possible.

BRIEF DESCRIPTION OF THE DRAWINGS

FIGS. 8A to 8C are block schematic diagrams of memory systems according to various embodiments.

FIGS. 10A, 10B, 10C-0 and 10C-1 are block diagram showing data transfer operations according to various embodiments.

DETAILED DESCRIPTION

Embodiments disclosed herein show systems that can incorporate programmable impedance elements based on a solid electrolyte layer that can enable fast write speeds with the benefit of non-volatility and hence improve the standby power and standby-to-active latency/performance of a system.

In particular embodiments, a solid electrolyte layer based memory (referred to here as a conductive bridging random access memory (CBRAM) type memory), can be incorporated into a system having a volatile memory. A high-bandwidth data transfer path can exist between the two memory types. SAVE operations, which store data from the volatile memory in the CBRAM type memory, and/or RESTORE operations, which read data into the volatile memory from the CBRAM type memory, can be faster and/or consume less power than corresponding operations performed by systems employing DRAM memory and Flash memory, such as that shown in FIG. 18.

In very particular embodiments, a system can incorporate CBRAM type memory and DRAM. CBRAM type memory can operate at voltages that are the same as DRAM or closer to DRAM than other nonvolatile memory types. In addition, a CBRAM type memory can have a read time that is comparable to a DRAM and/or faster than other nonvolatile memory types. CBRAM type memories can have a less complicated organization than Flash type memories (which can be organized into erasable blocks), and so can accommodate various access types, such as byte writes, enabling flexibility in type and manner of data transfers.

CBRAM type memory can be compatible with leading complementary metal-oxide-semiconductor (CMOS) fabrication processes. Accordingly, such CBRAM type memories can be incorporated into existing system architectures, as well as new architectures.

Figure 1:
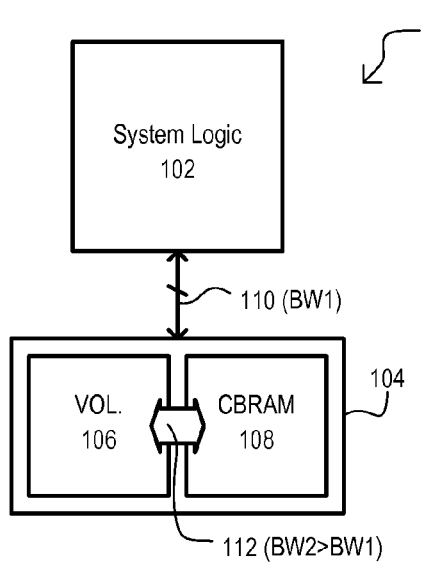
FIG. 1 is a block schematic diagram of a system according to one embodiment.

FIG. 1 shows a system 100 according to an embodiment. A system 100 can include system logic 102 and a memory system 104 connected to one another by a first data transfer path 110. System logic 102 can include logic circuits for executing functions of the system 100. In particular embodiments, system logic 102 can be a system-on-chip (SoC) circuit, and can include one or more processors for executing functions of the system and/or for controlling other peripheral circuits. Such other peripheral circuits can be digital and/or analog circuits. In a very particular embodiment, system logic 102 can be formed with complementary-metal-oxide-semiconductor (CMOS) type circuits.

A first data transfer path 110 can transfer data between system logic 102 and memory system 104 at a first bandwidth. A first bandwidth can be based on a bit width of the first data transfer path 110 and/or a rate at which data values can be transmitted.

A memory system 104 can include a volatile section 106 and a programmable impedance section 108 connected to one another by a second data transfer path 112. A volatile section 106 can be formed with volatile memory cells that will lose stored data in the absence of power. As but a few of many possible examples, a volatile section 106 can include dynamic random access memory (DRAM) type cells and/or static RAM (SRAM) type cells.

A programmable impedance section 108 can be formed with memory cells that store data states by operation of one or more solid electrolyte layer. Such a memory type will be referred to as a conductive bridging random access memory (CBRAM) herein. In some embodiments, a CBRAM section 108 can operate at a same power supply voltage as volatile section 106. This is in contrast to conventional systems that include electrically erasable and programmable read-only-memory (EEPROM), including flash EEPROM, which can require operating voltages substantially greater than that of a corresponding DRAM of the system. In particular embodiments, CBRAM section 108 can store data in a nonvolatile fashion and/or with a greater data retention time than volatile section 106.

Accordingly, while embodiments herein describe CBRAM sections, alternate embodiments can any other suitable memory technology having a different data retention time. Preferably, such other suitable memory technology can operate at a power supply no greater than that used for the volatile section.

A second data transfer path 112 can transfer data between volatile memory section 106 and CBRAM section 108 at a second bandwidth that is greater than the first bandwidth. Such a greater bandwidth can be accomplished with a greater bit width and/or a faster data transfer speed than first data transfer path 110.

According to embodiments, a second data transfer path 112 can be independent of first data transfer path 110, providing a data path only between volatile memory section 106 and CBRAM section 108. In this way, high-bandwidth data transfers can occur between a volatile memory section 106 and CBRAM section 108, enabling rapid storing of data from volatile section 106 to CBRAM section 108, and/or rapid recalling of data from CBRAM section 108 to volatile section 106.

A physical implementation of a second data transfer path 112 can take many forms. In some embodiments, a second data transfer path 112 can be implemented as wiring on a single die that includes the volatile section 106 and CBRAM section 108. In an alternate embodiment, in which volatile section 106 and CBRAM section 108 are formed on separate dies, a second data transfer path 112 can be implemented using die-to-die structures, such as through silicon vias (TSVs) that connect separate stacked devices, as but one very particular example.

Figure 18:
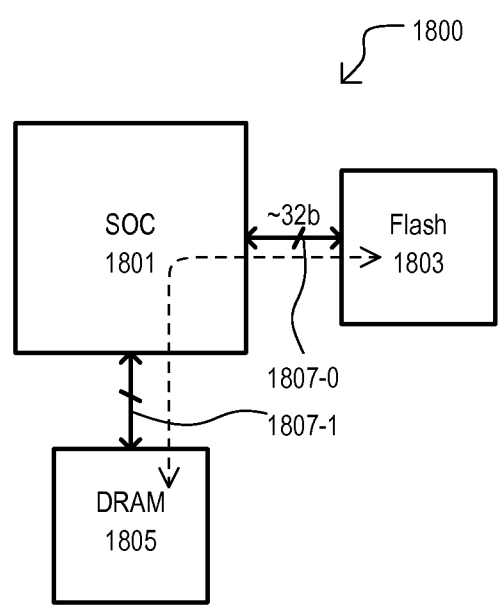
FIG. 18 is a block schematic diagram of a conventional system.

A second data transfer path 112 can provide power savings over conventional systems, like that of FIG. 18, as data in the volatile section 106 can be saved to the CBRAM 108 both quickly, and with less power than the conventional approach. Power savings can be achieved from any of: the speed at which data saves can occur; the reduced size of signal lines of the second data transfer path 112; or the reduced voltage needed to save data into CBRAM section 108. In a SAVE operation, data can be transferred from volatile section 106 (and system logic 102, in some embodiments) to CBRAM section 108 over second data transfer path 112. Power can then be removed from the system logic 102, the volatile section 106, and in some embodiments, the CBRAM section 108. At a later time, power can be returned to such portions of the system 100, and a RESTORE operation can use second data transfer path 112 to transfer data from CBRAM section 108 to volatile section 106 (and system logic 102, in some embodiments), thus restoring a previous operational state to the system 102.

In the embodiment of FIG. 1, a separate memory, like flash memory 1803 of FIG. 18, is not included. Accordingly, a memory section 104 can accommodate save/restore operations to save system states, and at the same time, can serve as file repository for the system 100, assuming the functions of a flash memory, like that of FIG. 18.

Figure 2:
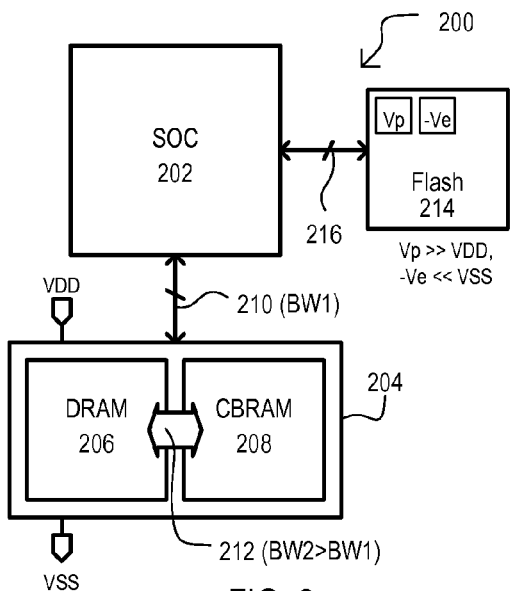
FIG. 2 is a block schematic diagram of a system according to another embodiment.

FIG. 2 shows system 200 according to another embodiment. FIG. 2 can include a system-on-chip circuit (SoC) 202, a memory system 204, and a Flash memory 214. SoC 202 can be connected to memory system 204 by a first data transfer path 210 and to Flash memory 214 by a third data transfer path 216. SoC 202 can include one or more processors that execute stored instructions, and can access Flash memory 214 and memory system 204.

A memory system 204 can include a DRAM section 206 and a CBRAM section 208 connected to one another by a second data transfer path 212. A second data path 212 can be up to many thousands of bits wide. With this wide data path, data may be moved between the two memory sections (206/208) quickly and without passing through the SoC 202. In addition, by implementing second data path 212 locally to the DRAM/CBRAM sections 206/208, a capacitance of wires making up such a data path can be small compared to wires that make up data transfer path 210, between SoC 202 and memory section 204. As a result, each data bit moved switches less capacitance. A second data transfer path 212 can transfer data between DRAM section 206 and CBRAM section 208 with a bandwidth that is greater than that of the first data transfer path 210 and greater than that of the third data transfer path 216. In very particular embodiments, a second data transfer path 212 can have a bit width that is substantially greater than that of the first and third data transfer paths 210/216.

A memory section 204 can operate with supply voltages VDD and VSS. Such voltages can be sufficient to enable the operation of DRAM section 206, as well as any programming and/or erasing of cells in the CBRAM section 208. In addition, an SoC 202 can also operate between the VDD and VSS voltages.

A flash memory 214 can store data in a nonvolatile fashion. In the embodiment shown, flash memory 214 can receive or generate a programming voltage (Vp) to program data values into its EEPROM cells, as well as an erase voltage (Ve) to erase sectors of such cells. A program voltage (Vp) can be greater than VDD, and an erase voltage (Ve) can be less than VSS. This is in sharp contrast to the CBRAM section 208 which can operate at VDD/VSS.

FIG. 2 shows a system in which a memory section 204 can be used to enhance save/restore operations, as compared to as system like that of FIG. 18, However, the flash memory 216 can remain to serve as all, or a portion of the file repository of the system 200.

Figure 3:
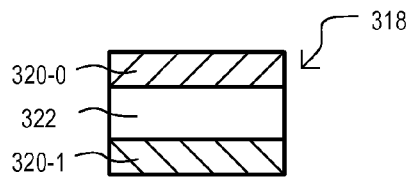
FIG. 3 is a side cross sectional view of a memory element that can be included in embodiments.

FIG. 3 shows a CBRAM element 318 that can be included in embodiments. A CBRAM element 318 can include a first electrode 320-0, a second electrode 320-1 separated from one another by one or more solid ion conductor layers 322. CBRAM element 318 can be programmed between different impedance states by applying electric fields that create or dissolve conductive regions formed by ionically mobile elements. A CBRAM element 318 included in the embodiments can be programmed between different resistance values and/or capacitance values by the creation/dissolution of such conductive regions. Further, a CBRAM element 318 state can provide impedance states that are static or dynamic. In the static case, a CBRAM element 318 state remains constant during a sense (e.g., read) operation. In contrast, in the dynamic case, a CBRAM element 318 may or may not change states during a sense operation. In one very particular dynamic case, in a sense operation, if a CBRAM element stores one data value, it will maintain a relatively high resistance. However, if a CBRAM element stores another data value, during the sense operation it can switch from a relatively high resistance to a lower resistance.

Figure 4:
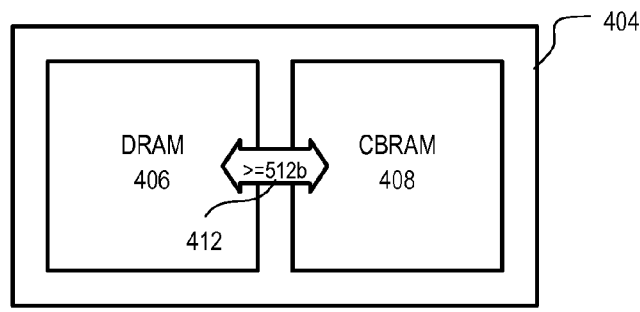
FIG. 4 is a block schematic diagram of a memory system according to an embodiment.

FIG. 4 shows a memory system 404, according to an embodiment. Memory system 404 can include a DRAM section 406 and a CBRAM section 408. A data transfer path 412 can have a wide data width, which in the particular embodiment shown, can be greater than or equal to 512 bits. Accordingly, in a SAVE or RESTORE operation, data can be transferred with wide data widths, for high speed SAVES/RESTORES. In addition, as noted above, when DRAM section 406 and CBRAM section 408 are formed on a same integrated circuit substrate, a data transfer path 412 can be formed of relatively short wiring paths, for reduced capacitance, and hence faster data transfer speeds and/or less power consumption than a system like that of FIG. 18.

It is noted that a memory system according to embodiments herein can have various configurations. Particular embodiments showing variations memory system architecture are shown in FIGS. 5A to 5C.

Figure 5A:
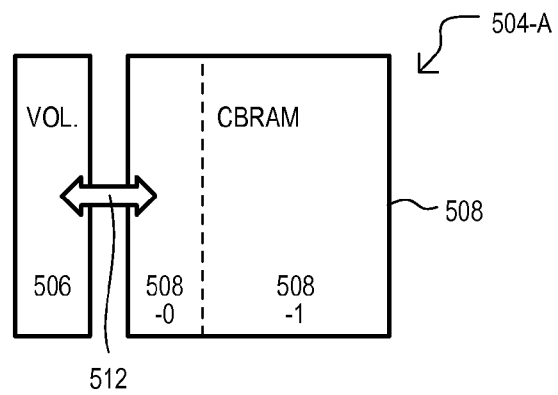
FIGS. 5A to 5C are block schematic diagrams of memory systems according to various embodiments.

FIG. 5A shows a memory system 504-A in which a size (i.e., storage capacity) of a volatile section 506 can be smaller than that of a CBRAM section 508. Accordingly, a CBRAM section 508 can include one portion 508-0 capable of storing all data within a volatile section 506. SAVE and RESTORE operations can use only a first portion 508-0 of CBRAM section 508. A second portion 508-1 can remain for other purposes, including serving as a file repository for a system, as but one example. In a SAVE operation, data from volatile section 506 can be transferred over data transfer path 512 to portion 508-0 of CBRAM section 508, and not to the other portion 508-1. Conversely, in a RESTORE operation, data can be transferred from CBRAM section 508-0 to volatile section 506.

It is understood that portions 508-0/1 of CBRAM section 508 can be physical divisions or logical divisions of the CBRAM section 508, or a combination of both. Further, portions 508-0/1 of CBRAM section 508 can be fixed (i.e., address ranges remain the same) or dynamic (address ranges can be changed).

Figure 5B:
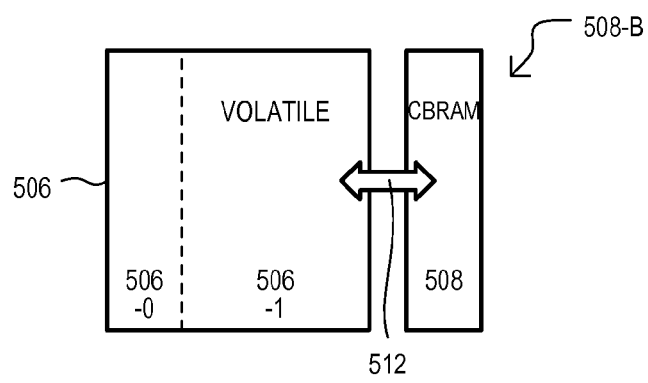
Figure 5C:
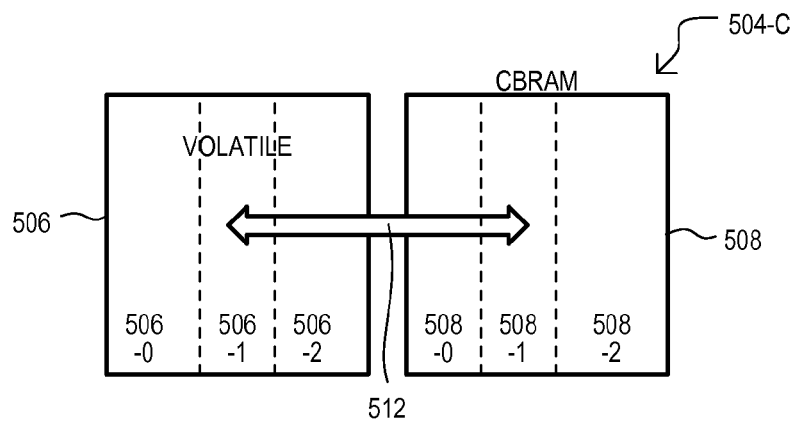

FIG. 5B shows a memory system 504-B in which a size of a volatile section 506 can be larger than that of a CBRAM section 508. Accordingly, a volatile section 506 can include one portion 506-0 that stores data to be saved in a SAVE operation. A second portion 506-1 can remain for other purposes. In a SAVE operation, data from portion 506-0 can be transferred over data transfer path 512 to CBRAM section 508. In some embodiments, data in portion 506-1 can be saved in some other memory (e.g., flash memory) or may be understood to be lost in a SAVE operation. In a RESTORE operation, data can be transferred from CBRAM section 508 to volatile portion 506-0. Portions 506-0/1 of volatile section 506 can be physical divisions or logical divisions of volatile memory section 506, or a combination of both. Further, portions 506-0/1 can be fixed or dynamic.

FIG. 5C shows a memory system 504-C in which an amount of data stored/recalled can be stored in a portion of each of the volatile section 506 and CBRAM section 508. In a save operation, data can be transferred via data transfer path 512 from volatile portion 506-1 to CBRAM portion 508-1. As in the other embodiments, portions 506-1/508-1 of volatile and CBRAM sections 506/508 can be physical divisions, logical divisions, or a combination of both. Further, portions 506-1/508-1 can be fixed or dynamic.

FIGS. 6A to 6D show data transfer operations according to additional embodiments. FIGS. 6A to 6D show a memory system 604 having a DRAM section 606, with portions 606-0/1 and a CBRAM section 608, having portions 608-0/1. DRAM section 606 and CBRAM section 608 can be connected to one another by high-bandwidth data transfer path 612. A DRAM section 606 can include a read circuit 664 and write circuit 668. CBRAM section 608 can include a program circuit 666 and a read circuit 670.

Figure 6A:
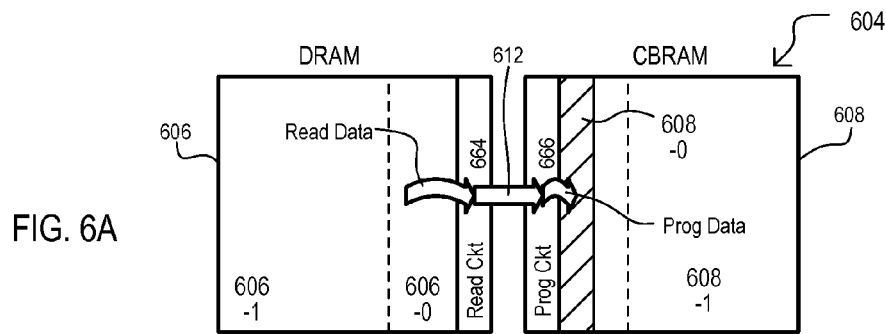
FIGS. 6A to 6D are a sequence of block schematic diagrams showing SAVE and RESTORE operations according to embodiments.
Figure 6B:
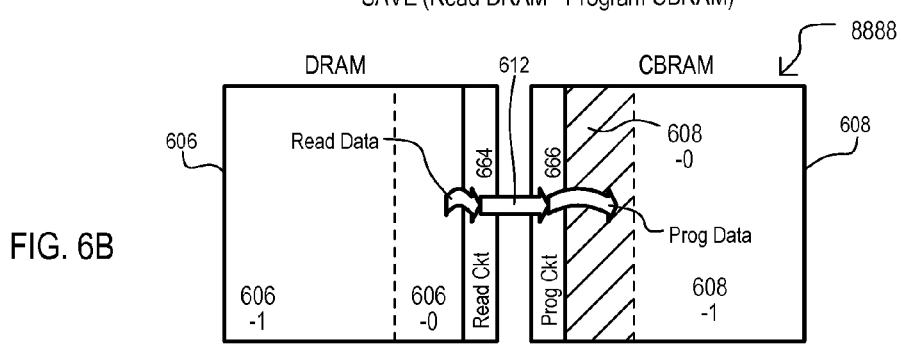

FIGS. 6A and 6B show a SAVE operation according to an embodiment. In the operation shown, DRAM portion 606-0 includes data to be saved in a CBRAM section 608 by the SAVE operation. FIG. 6A shows a first portion of the SAVE operation. A portion of the data to be saved can be read by read circuit 664 of DRAM section 664. Such data can be sent, via data transfer path 612, to CBRAM section 608. Program circuit 666 can program storage elements in CBRAM section 608-0 to store the read data received from the DRAM section 606.

FIG. 6B shows the remainder of data being read by DRAM read circuit 664, transferred over data transfer path 612, and programmed by CBRAM program circuit 666 into the remaining locations of CBRAM portion 608-0. It is understood that a program circuit 666 can write data values in a single program action, or in a multi-step program action (e.g., erase all CBRAM elements to one impedance state, then selectively program elements to another impedance state according to the write data).

Figure 6C:
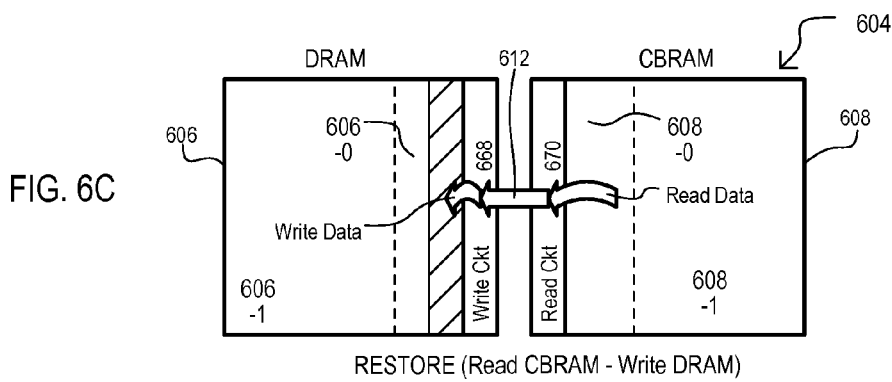
Figure 6D:
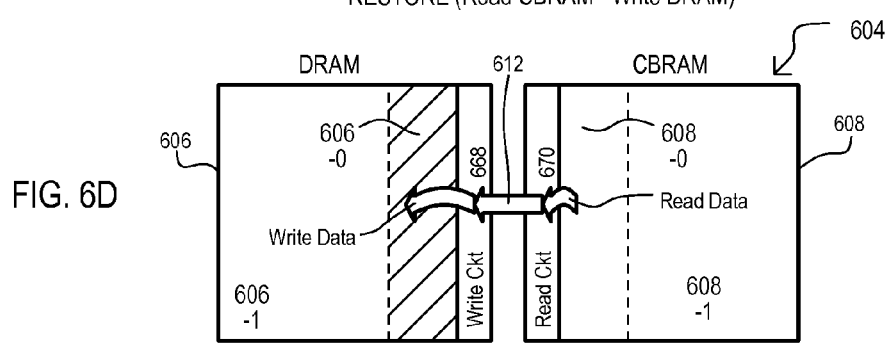

FIGS. 6C and 6D show a RESTORE operation according to an embodiment. In the operation shown, CBRAM portion 608-0 includes data to be restored back into DRAM section 606. FIG. 6C shows a first portion of the RESTORE operation. A portion of the data to be restored can be read by read circuit 670 of CBRAM section 608. Such data can be sent, via data transfer path 612, to DRAM section 606. Write circuit 668 can write DRAM memory cells in section 606-0 with the restore data. FIG. 6D shows the remainder of data being read by CBRAM read circuit 670, transferred over transfer path 612, and written by DRAM write circuit 668 into the remaining locations of DRAM portion 606-0.

FIGS. 7A to 7E show memory systems having various interface types.

Figure 7A:
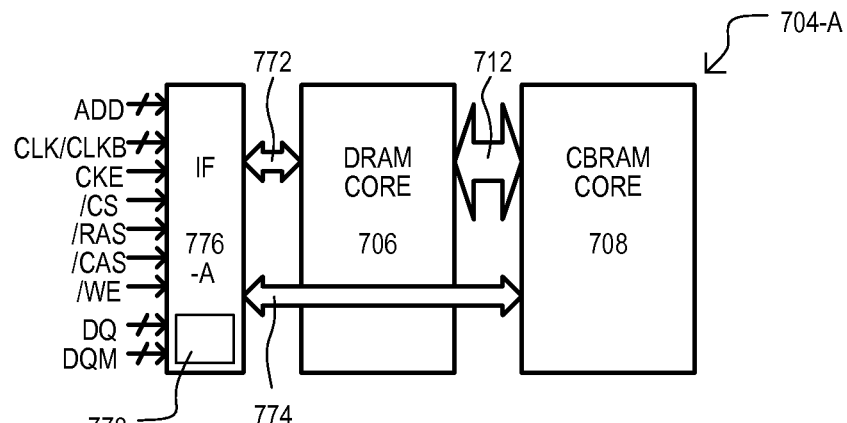
FIGS. 7A to 7E are block schematic diagrams of memory systems according to various embodiments.

FIG. 7A shows a memory system 704-A having a CBRAM section 708 a DRAM section 706 connected by a data transfer path 712. Memory section 704 also includes an interface 776-A. In SAVE and RESTORE operations, data can be transferred between DRAM section 706 and CBRAM section 708 over transfer path 712, which can be a high-bandwidth path as described herein, or equivalents. DRAM section 706 can include DRAM memory cells, decoder circuits, and read and write circuits. Similarly, CBRAM section 708 can include CBRAM memory cells, decoder circuits, program circuits, and read circuits.

An interface 776-A can receive a conventional set of RAM signals. In the particular embodiment shown, interface 776-A can take the form of a conventional DRAM interface, having a set of standard DRAM input and output signals. Thus, DRAM section 706 can be controlled in a conventional fashion via DRAM control path 772 using interface 776-A.

Unlike a conventional DRAM interface, interface 776-A can include a CBRAM access command decoder 778 which can enable CBRAM section 708 to be controlled by special input signal sets that would be considered invalid commands to a standard DRAM. In response to such special input signal sets, a CBRAM section 708 can be controlled via CBRAM control path 774.

While FIG. 7A shows an interface 776-A with a standard DRAM interface, alternate embodiments can include other conventional interfaces, such as an SRAM interface, as but one example.

According to embodiments, data transfers between DRAM section 706 and CBRAM section 708 over data path 712 can be controlled via interface 776-A, either directly or indirectly. In a direct case, control signals are applied to interface to enable high-bandwidth transfers between the sections 706/708. In an indirect case, a memory section 704-A can include a "copy engine" that is activated via interface 776-A to automatically transfer data blocks between the memory sections 706/708. In very particular embodiments, system logic (e.g., an SoC) can access interface 776-A to control operations of a memory section 704-A.

In this way, a memory section can have a standard interface that enables accesses to a volatile section (i.e., a DRAM section) via standard signal combinations, as well as accesses to CBRAM section via non-standard signal combinations.

Figure 7B:
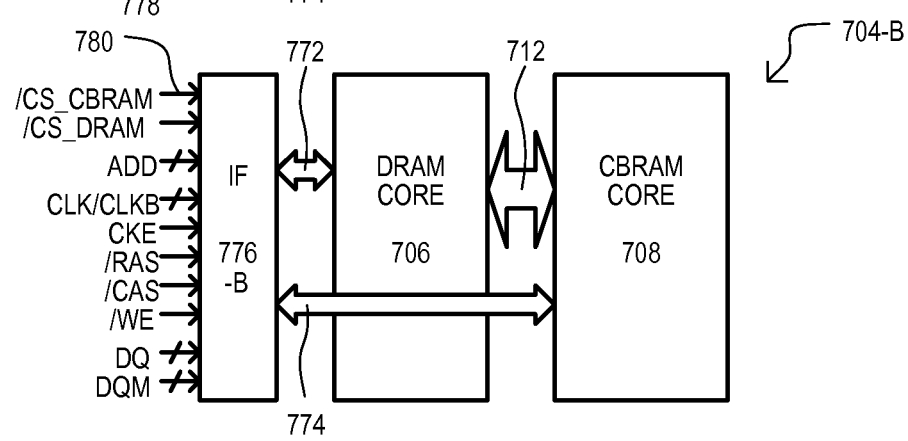

FIG. 7B shows a memory section 704-B having sections like those of FIG. 7A, but with a different interface 776-B. An interface 776-B can include a conventional set of RAM inputs and outputs, which in the particular embodiment, can be DRAM inputs and outputs. Thus, DRAM section 706 can be controlled in a conventional fashion via DRAM control path 772 using interface 776-B.

However, unlike a conventional DRAM interface, interface 776-B can include additional signal inputs that can enable control of CBRAM section 708. In the very particular embodiment shown, interface 776-B can receive and process an additional chip select signal (/CS_CBRAM) 780 to enable accesses to CBRAM section 708. Accordingly, when signal /CS_DRAM is active, DRAM section 706 can be accessed by operation of the of the other control signals. However, when signal /CS_CBRAM is active, CBRAM section 708 can be accessed by operation of the of the other control signals. Data transfers between DRAM section 706 and CBRAM section 708 over data path 712 can be controlled via interface 776-B either directly or indirectly. In very particular embodiments, system logic can access interface 776-B to control operations of a memory section 704-B.

In this way, a memory section can have an interface that includes extra signals in addition to standard signals to distinguish between accesses to a volatile section (i.e., a DRAM section) and a CBRAM section.

Figure 7C:
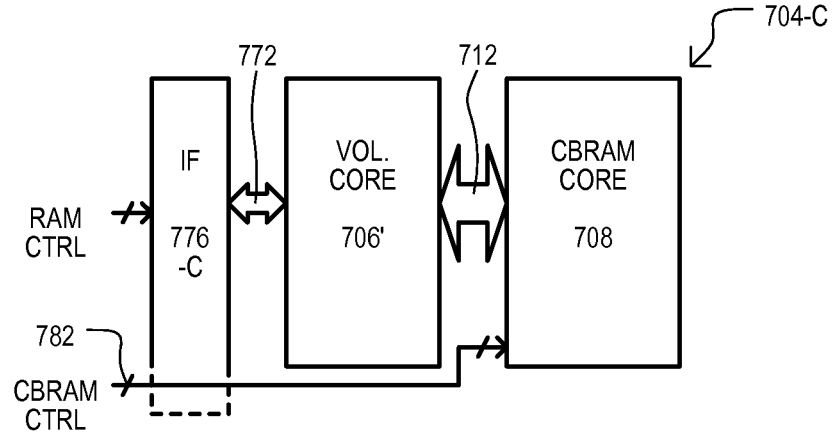

FIG. 7C shows a memory section 704-C having sections like those of FIG. 7A. However, unlike FIG. 7A, an interface 776-C can be a conventional volatile RAM interface, enabling access to a volatile memory section 706' via RAM control path 772.

To access a CBRAM section 708, a memory section 704-C can include interface signals 782 that are entirely independent of interface 776-C (i.e., out of band signals). Such interface signals 782 can be applied directly to CBRAM section 708, to control operations therein. Data transfers between DRAM section 706 and CBRAM section 708 over data path 712 can be controlled via CBRAM control signals 782 either directly or indirectly. In very particular embodiments, system logic can access interface 776-C and generate CBRAM control signals 782 to control operations of a memory section 704-C.

In this way, a memory section can include signals separate from a memory interface to control accesses to a CBRAM section.

Figure 7D:
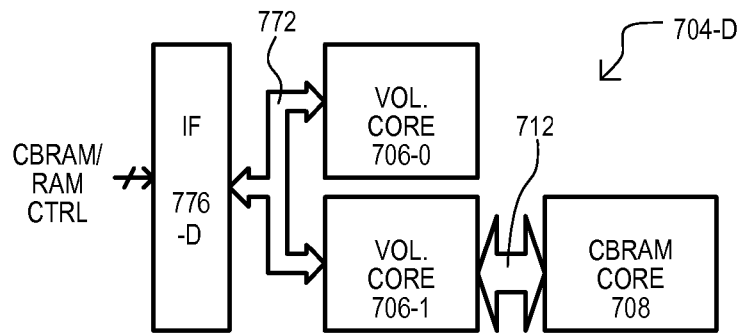

FIG. 7D shows a memory section 704-C having sections like those of FIG. 7A. However, unlike previous embodiments, a memory section 704-C can include some volatile memory sections (706-0) that are not connected to CBRAM section 708. Accordingly, in SAVE and RESTORE operations, data are transferred between CBRAM section 708 and volatile memory section 706-1, but not between CBRAM section 708 and volatile memory section 706-0.

In the embodiment shown, a high bandwidth data transfer path 712 can be connected between volatile memory section 706-1 and CBRAM section 708, but not between volatile memory section 706-0 and CBRAM section 708. An interface 776-D can take the form of any of those shown herein, or equivalents. In very particular embodiments, system logic can access interface 776-D to control operations of a memory section 704-D.

In this way, a memory section can include some volatile portions that are connected to a CBRAM section via a high-bandwidth data transfer path, while other volatile sections are not connected to the CBRAM section.

Figure 7E:
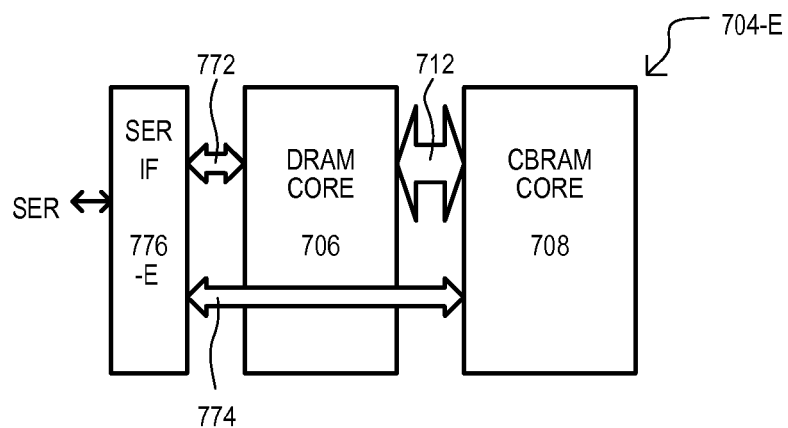

FIG. 7E shows a memory section 704-E having sections like those of FIG. 7A, but with a different interface 776-E. An interface 776-B can be a serial interface which can transmit and receive data and/or address values over one or more serial data streams.

It is understood that while FIGS. 7A to 7E show very particular interfaces, alternate embodiments can include any other suitable interface types.

FIGS. 8A to 8C show high-bandwidth data transfer paths according to various embodiments.

FIG. 8A shows a memory section 804-A in which interfaces to volatile and CBRAM sections are controlled by another circuit, such as system logic (e.g., SoC) to transfer data between the sections.

FIG. 8A shows a volatile section 806 connected to a CBRAM section 804 by a high-bandwidth data transfer path 812. A volatile section 806 can include a volatile array 886, decoder 892, and a wide read/write interface (R/W IF) 888. A volatile array 886 can include volatile memory cells that can store data values. A decoder 892 can decode volatile addresses ADD_VOL to access volatile memory cells. A wide R/W IF 888 can enable read and write operations to volatile memory cells within array 886 at large bit widths (e.g., 512 bits or greater).

A CBRAM section 806 can include a CBRAM array 884, a decoder 894, and a wide CBRAM program/read interface (P/R IF) 890. A CBRAM array 884 can include memory cells with CBRAM elements for storing data values. In some embodiments, memory cells in CBRAM array 884 can include one or more access devices (e.g., transistors) in combination with one or more CBRAM elements. A decoder 894 can decode CBRAM addresses ADD_CBRAM to access CBRAM memory cells. A wide P/R IF 890 can enable program and write operations to CBRAM memory cells within array 884. In particular embodiments, a wide P/R IF 890 can have a large bit width (i.e., greater than 512 bits).

In particular embodiments, SAVE and RESTORE operations can occur by system logic generating appropriate address values (ADD_VOL, ADD_CBRAM) and control values (CTRL_VOL, CTRL_CBRAM) to transfer data between CBRAM array 884 and volatile array 886 over transfer path 812.

FIG. 8B shows a memory section 804-B in which interfaces to volatile and CBRAM sections are controlled by a copy engine circuit, which can automatically transfer data between the sections.

FIG. 8B can include sections like those of FIG. 8A. In addition, FIG. 8B shows a copy engine 896. A copy engine 896 can receive a command indication CMD and address transfer values (ADD_XFER), and in response, can generate command and address values to transfer data between CBRAM array 884 and volatile array 886 over data transfer path 812. Address transfer values (ADD_XFER) can define the address spaces for the SAVE or RESTORE operations.

In particular embodiments, SAVE and RESTORE operations can occur by system logic applying an appropriate command to copy engine 896, which can then automatically execute data transfer operations over transfer path 812.

FIG. 8C shows a memory section 804-C in which a low bandwidth data path can be formed from a portion of a high-bandwidth transfer path.

FIG. 8C can include sections like those of FIG. 8A. In addition, FIG. 8C shows selection circuit 898. A selection circuit 898 can allow data to pass between a low-bandwidth data path 899 and high-bandwidth transfer path 812. A low-bandwidth 899 data path can be connected to system logic, as but one example.

In SAVE or RESTORE operations, data can be transferred between CBRAM section 808 and volatile section 806 by operation of R/W IF 888 and P/R IF 890, according to any of the embodiments shown herein, or equivalents. In "standard" read operation (e.g., access by system logic), the same interfaces (R/W IF 888 and P/R IF 890) can operate to access data. However, by operation of select circuit 898, only a portion of the data can be input or output on low-bandwidth transfer path 899. As but one example, a high-bandwidth data transfer path 812 can have a bit width of 512 bits. A selection circuit 898 can output a 64-, 32-, or 16-bit portion of such 512 bits on the low-bandwidth data transfer path 899.

Figure 9:
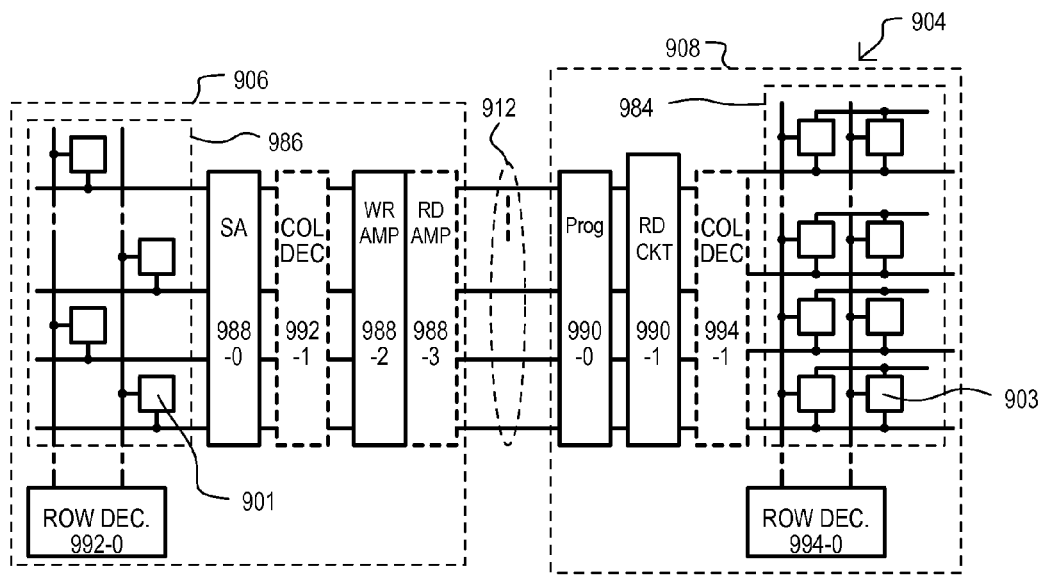
FIG. 9 is a block schematic diagram of a memory system according to one particular embodiment.

FIG. 9 shows a memory system 904 according to another embodiment. A memory system 904 can include sections like those shown in above embodiments. In FIG. 9, a volatile section 906 can include memory cells (one shown as 901) arranged into a memory cell array 986 having rows and columns. One or more rows of memory cells 901 can be accessed via a row decoder 992-0. In SAVE operations, data corresponding to rows of memory cells can be sensed by a sense amplifier circuit 988-0. Optionally, bits from read data can be selected with a column decoder 992-1. In particular embodiments, data transfers occur on a row basis to avoid any delay introduced by column decoding. Optionally, row data can be further amplifier by a read amplifier 988-2 to drive such data on data transfer path 912.

In a RESTORE operation, write data can be received by volatile section 906 via data transfer path 912. A write amplifier 988-1 can amplify such data. Optionally, selected of the data can be applied via a column decoder 992-1. However, as noted above, in particular embodiments, data can be written on a row-wise basis into volatile array 986.

In FIG. 9, a CBRAM section 908 can include CBRAM cells (one shown as 903) arranged into a CBRAM cell array 984 having rows and columns. One or more rows of memory cells 903 can be accessed via a row decoder 994-0. In SAVE operations, data corresponding to rows of memory cells can be received over data transfer path 912. Program circuit 990-0 can generate bias voltages suitable to write the received data values into memory cell array 984. In some embodiments, such actions can include erasing CBRAM elements to one state (e.g., a high impedance), then selectively programming some to a low impedance state based on the received data. Optionally, bits to be programmed into CBRAM cell array 984 can be selected with a column decoder 994-1. However, in particular embodiments, data transfers occur on a row basis to avoid any delay introduced by column decoding.

In a RESTORE operation, row(s) of data in CBRAM cell array 984 can be read by read circuit 990-1. Optionally, selected of the data can be read via a column decoder 994-1. However, as noted above, in particular embodiments data can be read on a row-wise basis from CBRAM cell array 984 directly onto data transfer path 912.

A data transfer path 912 can be a high-bandwidth data transfer path. High transfer speeds can be accomplished with very wide bit widths (e.g., 512-bits wide or more), fast interface circuits, shorter data signal paths (e.g., from volatile array to CBRAM array on a same integrated circuit), or combinations thereof.

Having described various architectures and circuits according to embodiments, data transfers, according to particular embodiments will now be described.

Figure 10A:
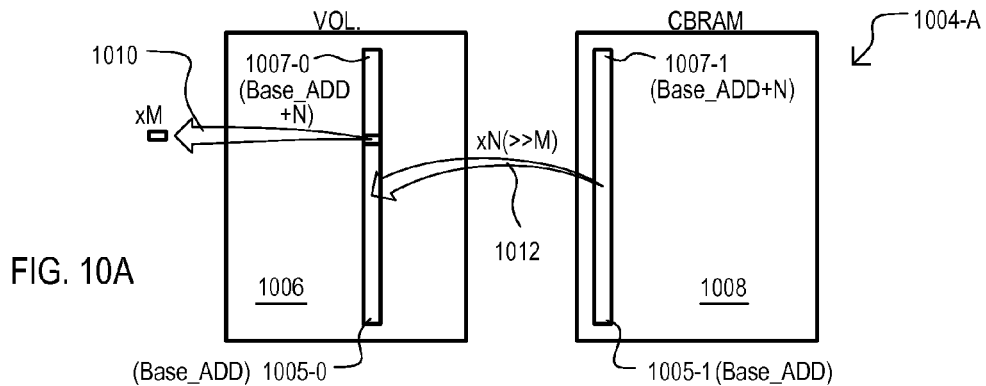

FIG. 10A shows all, or a portion of, a RESTORE operation for a memory system 1004-A according to one embodiment. FIG. 10A shows a CBRAM section 1008 having a data group of N bits, starting at a base address 1005-1. A data transfer path 1012 can have a data width of N-bits. Accordingly, in a RESTORE operation, groups of N-bits can be transferred in a single operation from CBRAM section 1008 to volatile section 1006. In particular embodiments, N can be 512 bits or more.

In the embodiment of FIG. 10A, a volatile section 1006 can have an interface of N-bits with data transfer path 1012. Accordingly, as groups of N-bits are received, such bits can be written in one operation into an N-bit block within volatile section 1006 (beginning at base address 1005-0 in FIG. 10A). Subsequently, data in volatile section 1006 can be accessed via a low-bandwidth data transfer path 1010 by system logic (e.g., SoC), or other portions of a system. In very particular embodiments, a low-bandwidth data transfer path 1010 can have a bit width of no more than 64 bits (excluding any parity/error bits).

It is understood that SAVE operations can occur in the reverse manner, with groups of N-bits being read from volatile section 1006 onto data transfer path 1012 with a single read operation. Such N-bits can then be programmed into locations of CBRAM section 1008 in a single program operation.

Figure 10B:
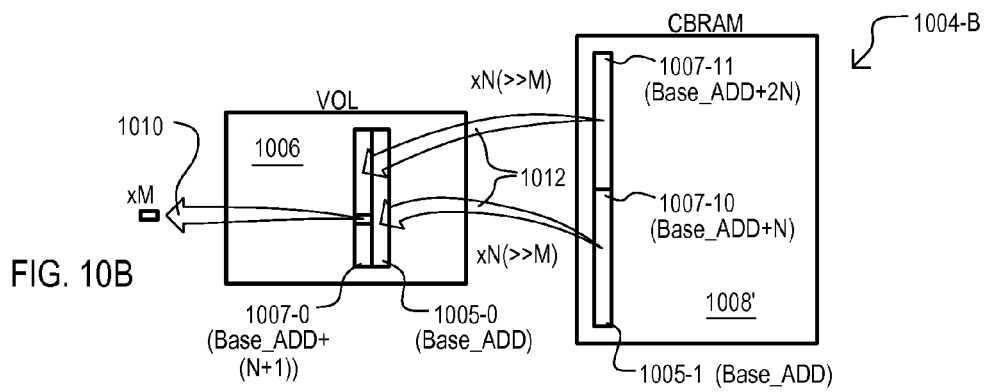

FIG. 10B shows all, or a portion of, a RESTORE operation for a memory system 1004-C according to another embodiment. FIG. 10B shows a memory system 1004-B in which an interface of a volatile section 1006 can be smaller than that of a CBRAM section 1008'. Thus, a CBRAM section 1008' can be capable of accessing data at one width (e.g., x2N), but a volatile section 1006 can only read or write data at a smaller width (e.g., xN). In particular embodiments, N can be 512 bits or more.

FIG. 10B shows a CBRAM section 1008' having a data group of 2N bits, starting at a base address 1005-1. A data transfer path 1012 can have a data width of N-bits. At the same time, a volatile section 1006 can have an interface of N-bits connected with data transfer path 1012. Accordingly, while groups of 2N bits are accessed in a single operation (e.g., a single read operation) in CBRAM section 1008, such bits can be written in two operations into N-bit blocks within volatile section 1006 (beginning at base address 1005-0 in FIG. 10A). Subsequently, data in volatile section 1006 can be accessed via a low-bandwidth data transfer path 1010 by system logic (e.g., SoC), or other portions of a system.

It is understood that SAVE operations can occur in the reverse manner, with groups of N-bits being read from volatile section 1006 onto data transfer path 1012 with a sequence of read operations. Such N-bits can be collected into a larger group (e.g., x2N), and then be programmed into locations of CBRAM section 1008' in a single program operation. In some embodiments, a CBRAM section 1008' can include data latches for accumulating multiple data transfers from volatile section 1006.

Figures 0, 10C:
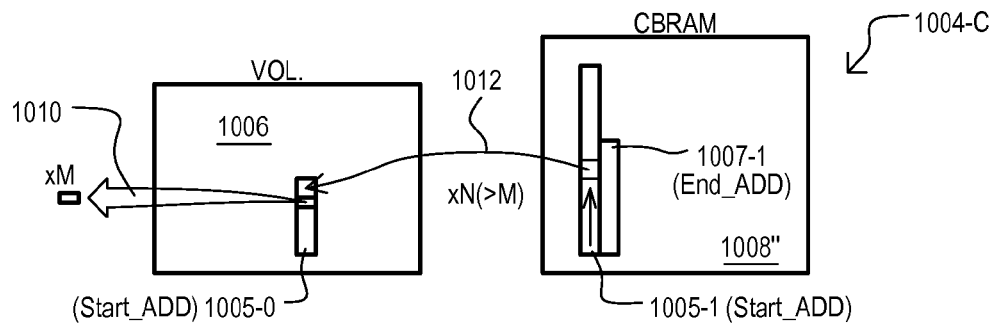
Figures 1, 10C:
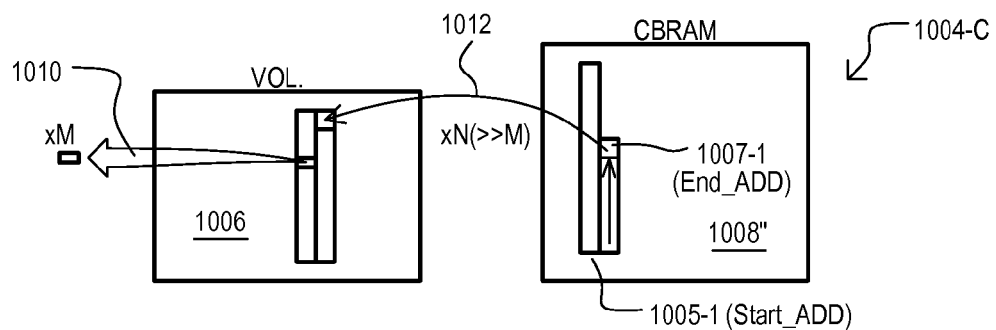

FIGS. 10C-0/1 show a RESTORE operation for a memory system 1004-C according to another embodiment. FIGS. 100-0/1 show a memory section 1004-C in which an interface of a CBRAM section 1008" is larger, but not substantially larger, than that of volatile section 1006. Thus, data can be transferred between volatile section 1006 and CBRAM section 1008" with multiple high-speed data transfers. In a particular embodiment, a speed of data transfers over path 1012 can be faster than those over path 1010.

FIG. 10C-0 shows an initial portion of a RESTORE operation according to one embodiment. CBRAM group 1008" can have a data group starting at a start address 1005-1 and ending at an end address 1007-1. FIG. 10C-0 shows a RESTORE operation after a portion of the data group has been read and written into volatile portion 1006. As data is stored in volatile section 1006, such data can be accessed via a low-bandwidth data transfer path 1010, by system logic (e.g., SoC), or other portions of a system.

FIG. 10C-1 shows an end of a RESTORE operation according to one embodiment. A last data value at end address 1007-1 can be transferred to volatile section 1006.

It is understood that SAVE operations can occur in the reverse manner, with groups of N-bits being read from volatile section 1006 onto data transfer path 1012 with multiple operations. Corresponding program operations can program each N-bit group into CBRAM section 1008".

FIGS. 10A to 10C-1 are understood to be but particular embodiments. Further, while FIGS. 10A to 10C-1 show the transfer of a particular block of data, such transfers can repeated multiple times for larger blocks of data.

In some embodiments, data stored in memory sections can have the constraint that the lengths of data blocks in the volatile section and CBRAM section can be the same. Accordingly, region pairs (i.e., storage regions in volatile and CBRAM portions) can be specified by 1) a volatile memory base address, 2) a CBRAM base address, and 3) a common length. In embodiments, bases can be multiples of a width of the high-bandwidth data transfer path, and lengths of data regions can be integral multiples of the high-bandwidth data transfer path.

In some embodiments, a copy engine (e.g., 896 of FIG. 8B) or controlling system logic (e.g., SoC) can maintain internal copy pointers, one for a volatile section and one for the CBRAM section. Prior to a SAVE or RESTORE operation, such pointers can be initialized to a volatile section base address and CBRAM section base address, respectively. During a SAVE operation, starting as such base addresses, a controlling circuit can copy from a volatile section to the CBRAM section (and vice-versa for a RESTORE operation). If needed, a number of such transfers may be implemented, In some embodiments, a system can include software which can indicate to a controlling circuit which regions are to be moved in the SAVE/RESTORE operation by accessing stored copy instruction data. Such copy instruction data can be stored in a CBRAM section, in a volatile section, in other registers in a larger system device, or in another memory of a larger system (i.e., flash memory).

As noted above, in conventional systems like that of FIG. 18, system operations may not be possible until a restore operation is finished (i.e., data from a flash memory has been loaded into a DRAM). In sharp contrast, in some embodiments, restore data can be available regardless of the progress of a RESTORE operation. Examples of such RESTORE operations (i.e., zero delay RESTOREs) will now be described.

Figure 11:
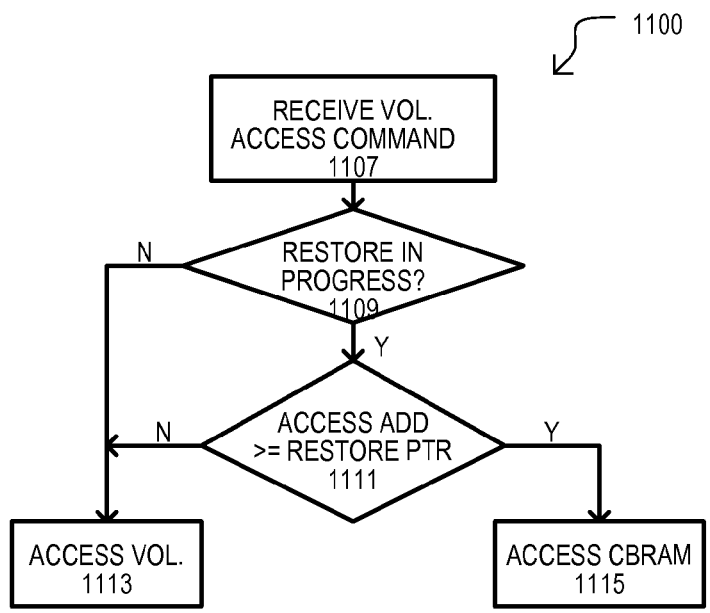
FIG. 11 is a flow diagram of a zero delay RESTORE operation according to an embodiment.

FIG. 11 is a flow diagram showing a zero delay RESTORE method 1100, according to an embodiment. A method 1100 can include receiving a volatile memory access command 1107. Such an action can include receiving a read or write command from system logic (e.g., SoC), or the like. A method 1100 can determine if a RESTORE operation is in progress 1109. If a RESTORE operation is not in progress (N from 1109), a method 1100 can access a volatile memory 1113 in a conventional system memory access operation.

In contrast, if a RESTORE operation is in progress (Y from 1109), a method 1100 can compare an access address to a restore pointer value 1111. Such an action can include comparing the address of a write or read operation to an address pointer value, where the pointer value indicates the progress of the RESTORE operation. In the particular embodiment shown, an address values greater than or equal to the pointer value can indicate memory locations currently being written with data from CBRAM or memory locations that have not yet been written with CBRAM data. Thus, if an access address is less than the address pointer value (N from 1111), the volatile memory section can be accessed 1113 (i.e., data values can be read from or written to the volatile memory section). In contrast, if an access address is greater than or equal to the address pointer value (Y from 1111), the CBRAM can be accessed 115 (i.e., data values can be read from or programmed into the CBRAM section).

In this way, if data has not yet been restored to a volatile memory section, such data can be accessed from the CBRAM section storing the data for the RESTORE operation.

FIGS. 12A to 12F are block diagrams showing zero delay RESTORE operations according to particular embodiments. FIGS. 12A to 12F show a memory system 1204 that includes a volatile section 1206, CBRAM section 1208, volatile start and end pointers StartPtrV/EndPtrV and CBRAM start and end pointers StartPtrCB/End PtrCB.

Figure 12A:
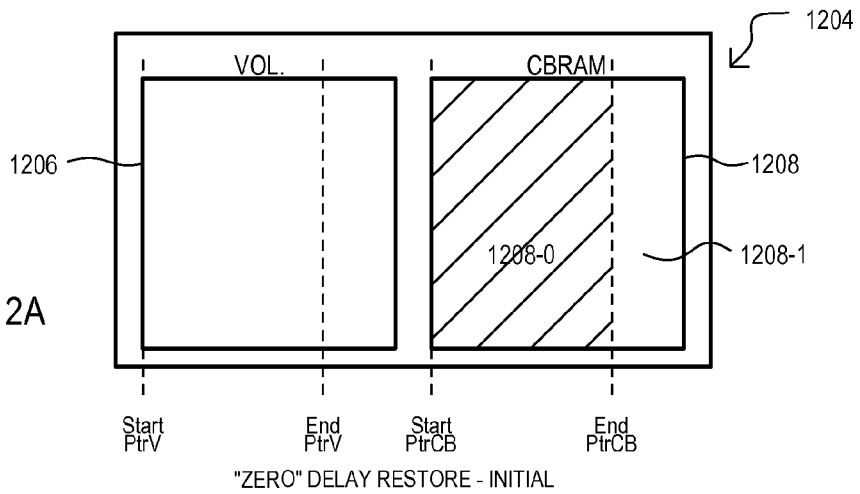
FIGS. 12A to 12F are a sequence of block schematic diagrams showing zero delay RESTORE operations according to embodiments.

FIG. 12A shows a memory system 1204 in an initial state, prior the start of the RESTORE operation. Restore data can be stored in a first portion 1208-0 of a CBRAM section 1208, ready for transfer to volatile section 1206. StartPtrCB can indicate a first address of the restore data, while EndPtrCB can indicate the last address of the restore data. Within volatile section 1206, pointers StartPtrV/EndPtrV can define the memory space that is to receive the restore data.

Figure 12B:
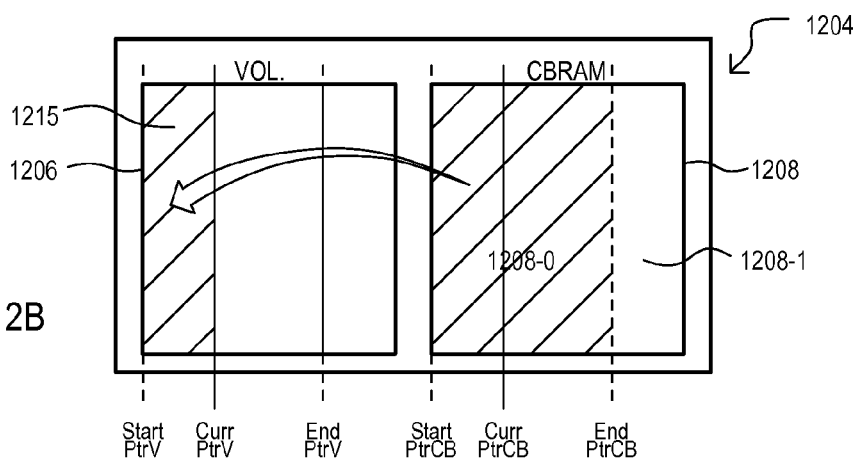

FIG. 12B shows memory system 1204 while a RESTORE operation is in progress. A portion of the restore data has been read from the CBRAM section 1206 and written into the volatile section 1206. In particular, locations up to an address indicated by CurrPtrCB have been copied from CBRAM section 1208 into volatile memory section 1206. Correspondingly, locations up to an address indicated by CurrPtrV have been written with such data (i.e., have been restored).

Figure 12C:
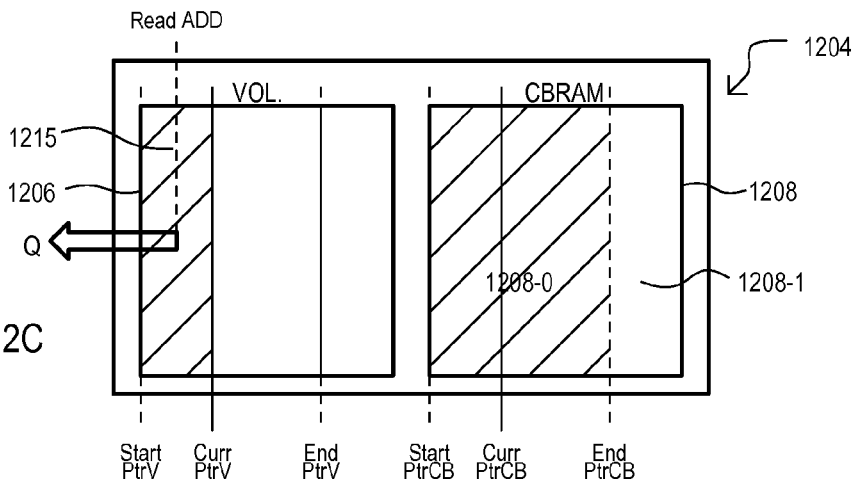

FIG. 12C shows memory system 1204 while a RESTORE operation is in progress and it is subject to read request at an address below CurrPtrV. In such a case, the volatile memory address corresponding to the read operation (Read ADD) stores valid data. As a result, the read operation can occur at the read address of the volatile section 1206.

Figure 12D:
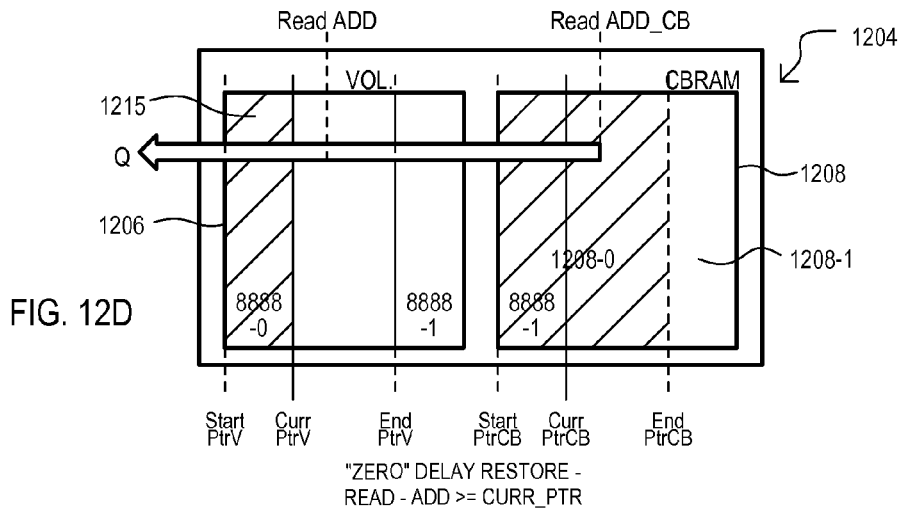

FIG. 12D shows memory system 1204 while a RESTORE operation is in progress and it is subject to a read request at an address above CurrPtrV. In such a case, the location within volatile section 1206 corresponding to the read operation (Read ADD) does not store valid data (i.e., it has yet to be restored). As a result, the read operation can occur at the location within CBRAM 1208 corresponding to the read address of the volatile section 1206 Read ADD_CB. That is, data can be read from the CBRAM section location storing data that will be written to Read ADD by the RESTORE operation.

Figure 12E:
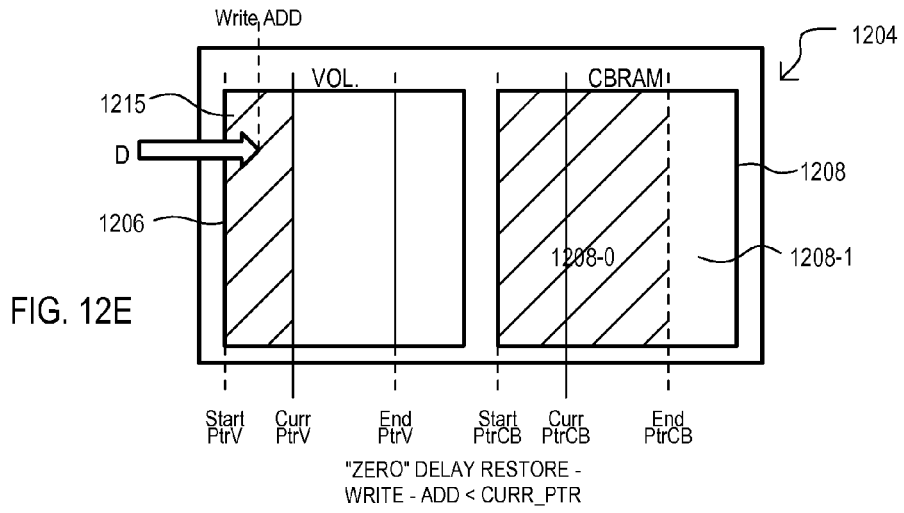

FIG. 12E shows memory system 1204 while a RESTORE operation is in progress and it is subject to write request at an address below CurrPtrV. In such a case, the address corresponding to the write operation (Write ADD) has already been restored. As a result, the write operation can occur at the write address of the volatile section 1206 to update the data.

Figure 12F:
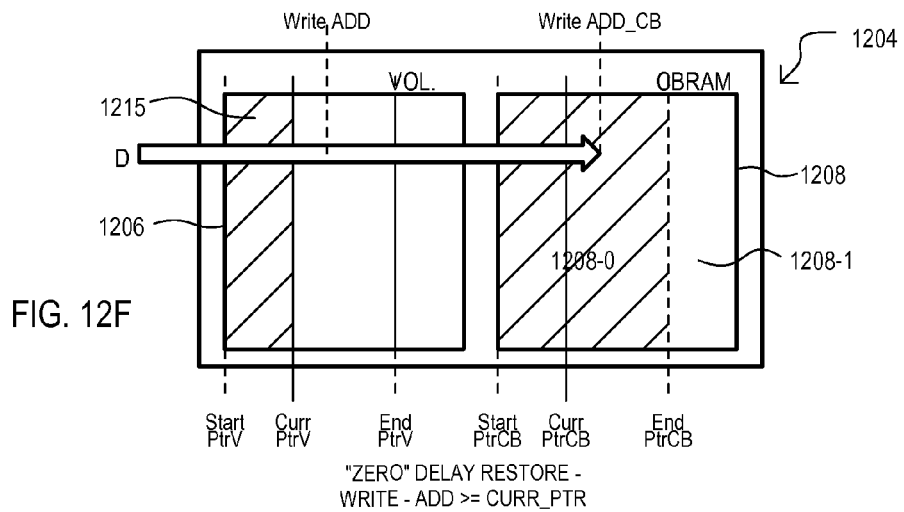

FIG. 12F shows memory system 1204 while a RESTORE operation is in progress and it is subject to a write request at an address above CurrPtrV. In such a case, the location within volatile section 1206 corresponding to the write operation (Write ADD) has not yet been written with the restore data. As a result, the write operation can occur at the location within CBRAM 1208 corresponding to the write address of the volatile section 1206 Write ADD_CB. That is, data can be written (i.e., programmed) into the CBRAM section location storing data that will be written to the Write ADD by the RESTORE operation.

While embodiments above have shown memory systems with start and end pointers indicating a continuous address space for copy, alternate embodiments can transfer non-contiguous address spaces. As but two examples, memory systems can include linked list of pointers, or some address generation algorithm.

Figure 13:
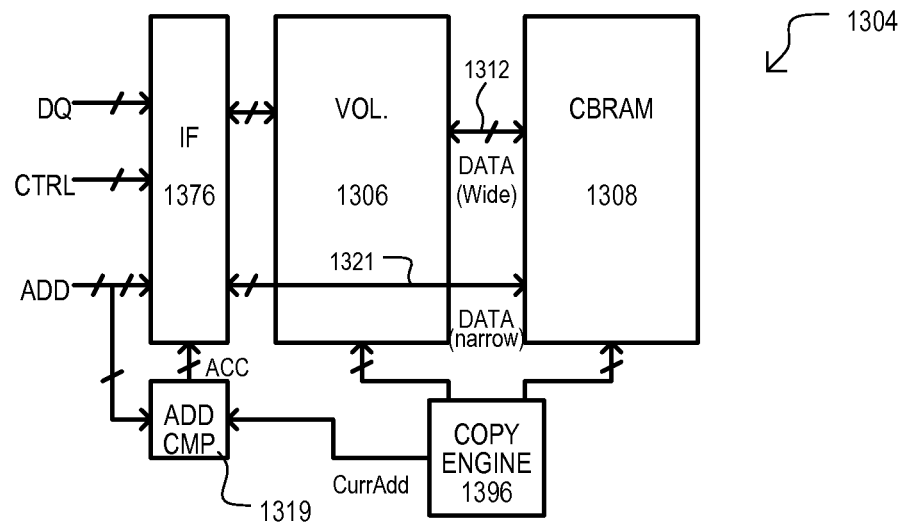
FIG. 13 is a block schematic diagram of a memory system that can execute zero delay RESTORE operations according to an embodiment.

FIG. 13 shows a memory section 1304 that can provide zero delay restore operations according to an embodiment. A memory section 1304 can include a CBRAM section 1308 and a volatile section 1306 connected by a high-bandwidth data transfer path 1312. Memory section 1304 also includes an interface (IF) 1376, a copy engine 1396, and an address comparator 1319. IF 1376 can enable accesses to volatile section 1306 and CBRAM section 1308.

A copy engine 1396 can enable automatic data transfers between volatile section 1306 and CBRAM section 1308 over data transfer path 1312, as described herein, or equivalents. Copy engine 1396 can provide one or more values (CurrAdd) indicating the progress of a RESTORE operation. In one very particular embodiment, a CurrAdd can be an address of volatile section 1206 that is currently being written to (i.e., like CurrPtrV, in FIGS. 12B to 12F).

An address comparator 1319 can compare an address received with an access request to the CurrAdd value. Based on such a comparison, address comparator 1319 can provide an access select value (ACC) to IF 1376. If a RESTORE operation is in progress, and IF 1376 can enable an access to volatile section 1306 or CBRAM section 1308 based on select value ACC.

Figure 14:
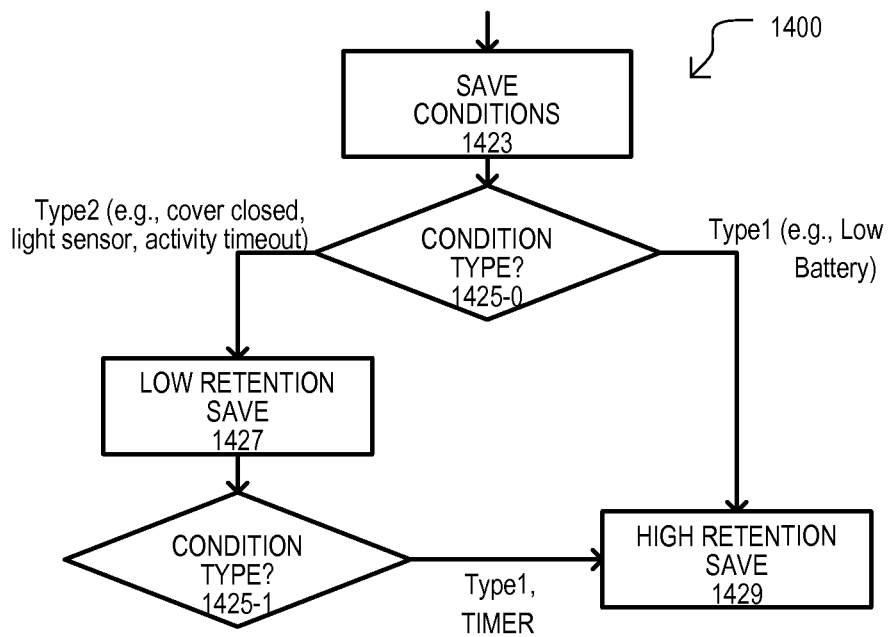
FIG. 14 is a flow diagram of RESTORE and/or SAVE operations that can include different data retention times according to embodiments.

FIG. 14 shows a method 1400 for executing SAVE operations for a memory device that can program CBRAM cells with different data retention/wear characteristics. A method 1400 can include determining if save conditions are indicated 1423. If save conditions are indicated, a type of save can be performed depending upon the particular conditions 1425-0. FIG. 14 shows two categories of conditions (Type 1, Type 2) corresponding to two different save types. However, it is understood that alternate embodiments can include more than two different save types.

For one type of condition (Type 1), a high retention, high wear save operation 1429 can be executed. A Type 1 condition can involve the need to store data for a relatively long period of time. For example, one Type 1 condition can be when a low battery alert for a system is indicated. A high retention/wear operation can result in the transferring data from a volatile section to a CBRAM section, and programming such data into the CBRAM section, as described herein, or equivalents. Such programming can result in CBRAM elements retaining data for a relatively long period of time. For example, a relatively long period of time can be months, years, or many years. In some embodiments, such high retention/wear writes can be at higher energy conditions and/or longer times than low retention/wear writes.

For another type of condition (Type 2), a low retention, low wear save operation 1427 can be executed. A Type 2 condition can involve the need to store data for a relatively short period of time. For example, type 2 conditions can involve a device being placed in a temporary non-operational state (e.g., its cover is closed, a light sensor indicates no activity, or the device has no activity for a certain amount of time). A low retention/wear operation can also result in the transferring data from a volatile section to a CBRAM section, and programming such data into the CBRAM section, as described herein, or equivalents. However, such programming can result in CBRAM elements retaining data for a relatively short period of time. For example, a short period of time can include a few days, or less. In some embodiments, such low retention/wear writes can be at lower energy conditions and/or shorter times than high retention/wear writes.

Figure 15:
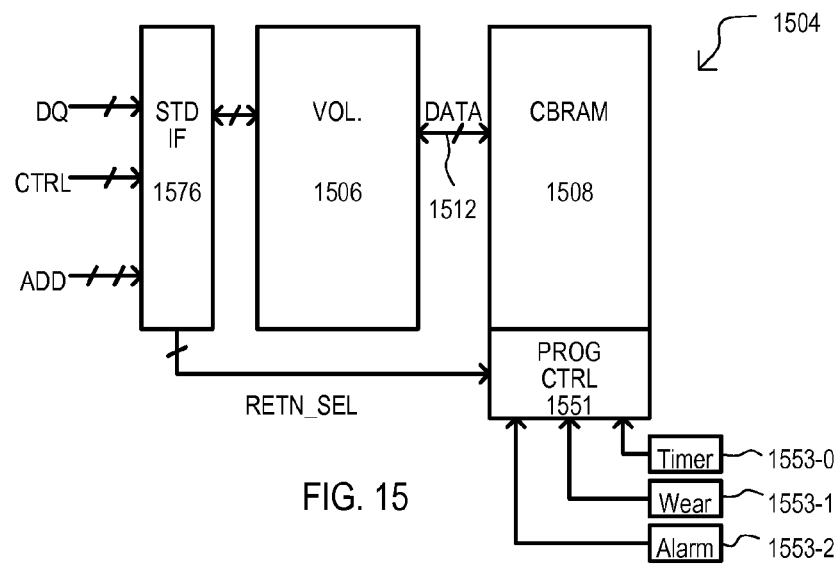
FIG. 15 is a block schematic diagram of a memory system that can execute RESTORE and/or SAVE operations with different data retention times, according to embodiments.

FIG. 15 shows a memory section 1504 that can provide varying retention times for memory elements in a CBRAM section. A memory section 1504 can include an interface (IF) 1576, a program control circuit 1551, and a CBRAM section 1508 connected to a volatile section 1506 by a high-bandwidth data transfer path 1512. A CBRAM section 1508 can include memory elements programmable between two or more data retention times. It is understood that such a difference in data retention times can apply to one state (e.g., a low impedance state but not a high impedance) or multiple states.

IF 1576 can provide access to volatile section 1506, CBRAM section 1508, and can control transfers between the two, as described herein, or equivalents, including the use of a copy engine. In addition, in the very particular embodiment shown, IF 1576 can generate a retention selection value (RETN_SL) for application to a program control circuit 1551, which can establish a retention time for program operations.

Program control circuit 1551 can program CBRAM elements within CBRAM section 1508 to one of multiple data retention times. In the embodiment shown, a program control circuit 1551 can establish a data retention time for program operations based on received value (e.g., RETN_SEL is activated by an input command). However, data retention times can be established by any of many alternate ways.

In some embodiments, a program control circuit 1551 can establish a data retention time based on a timer 1553-0. If a predetermined amount of time has passed, a program control circuit 1551 can execute a long retention write to a CBRAM in a SAVE operation. In contrast, if a predetermined amount of time has not passed, a program control circuit 1551 can execute a short retention write to a CBRAM in a SAVE operation.

In addition or alternatively, a program control circuit 1551 can establish a data retention time based on a wear value 1553-1. A wear value 1553-1 can indicate how much a CBRAM section has been accessed. If a wear value exceeds a limit, a program control circuit 1551 can execute a long retention write to a CBRAM in a SAVE operation. In contrast, if a wear value does not exceed any limits, a program control circuit 1551 can execute a short retention write to a CBRAM in a SAVE operation.

In addition or alternatively, a program control circuit 1551 can establish a data retention time based on an alarm 1553-2. An alarm 1553-2 can indicate a system status that may necessitate a SAVE operation. In one very particular embodiment, if power has been removed, or if a power supply is now limited (e.g., a battery low), a program control circuit 1551 can execute a long retention write to a CBRAM in a SAVE operation. Otherwise, a program control circuit 1551 can execute a short retention write to a CBRAM in a SAVE operation.

In some embodiments, a short data retention time can be on the order of minutes, hours, days, or even years, while a long data retention time can be substantially nonvolatile, lasting many years or longer.

Figure 16:
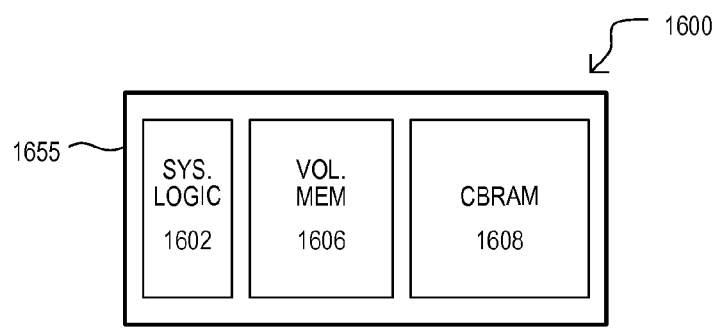
FIG. 16 is a plan view of an integrated circuit system according to an embodiment.

Systems according to embodiments can take various forms. FIG. 16 shows a system 1600 in which system logic 1602, a volatile memory section 1606 and a CBRAM section 1608, are all formed in the same integrated circuit substrate 1655. In such an embodiment, a high-bandwidth data transfer path (not shown) can be formed with one or more interconnect layers, for a high speed signal connections between the two memory sections (1606/1608).

Figures 17A, 17B:
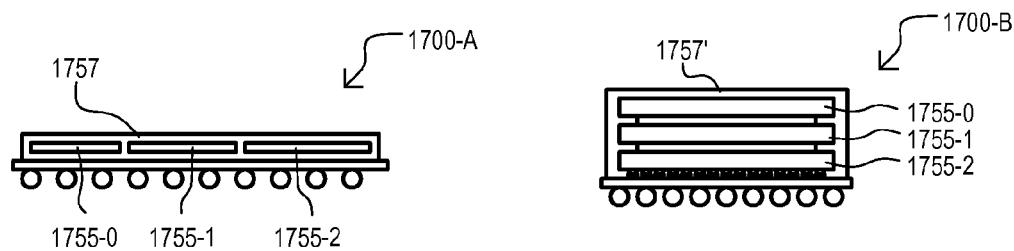
FIGS. 17A and 17B are side cross sectional views of multi-chip package systems according to embodiments.

FIG. 17A is a side cross sectional view of a system 1700-A according to another embodiment. System 1700-A can include a number of integrated circuits (ICs) 1755-0, -1, -2 formed in a same multi-chip package 1757. ICs 1755-0/1/2 can include a volatile memory section and CBRAM section. Such memory sections can be formed on a same IC, in which case a high-bandwidth data transfer path can be formed in such an integrated circuit. However, in an alternate embodiment, a CBRAM section can be formed in a separate IC than a volatile memory section. In such an embodiment, a high-bandwidth data transfer path can be formed by packaging connections.

In some embodiments, a system 1700-A can further include system logic. Such logic can be formed on a same IC as a CBRAM section, a same IC as a volatile memory section, or an entirely different IC. In addition or alternatively, a system 1700-A can include a third memory type (e.g., flash memory). Such a third memory type can be formed on a same IC as a CBRAM section, a same IC as the volatile memory section, or an entirely different IC.

FIG. 17B is a side cross sectional view of a system 1700-B according to another embodiment. System 1700-B can include a number of ICs 1755-0/1/2 formed in a same integrated circuit package 1757'. Unlike the embodiment of FIG. 17A, ICs 1755-0/1/2 can be vertically stacked.

As in the case of FIG. 17A, a volatile memory section and CBRAM section can be formed on a same IC, in which case a high-bandwidth data transfer path can be formed in such an integrated circuit. However, in an alternate embodiment, a CBRAM section can be formed in a separate IC than a volatile memory section. In such an embodiment, a high-bandwidth data transfer path can be formed by vertical packaging connections, such as TSVs, as but one example.

Again, as in the case of FIG. 17A, a system 1700-B can include further include system logic formed on a same IC as a CBRAM section, a same IC as a volatile memory section, or an entirely different IC. In addition or alternatively, a system 1700-B can include a third memory type formed on a same IC as a CBRAM section, a same IC as the volatile memory section, or an entirely different IC.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A system, comprising:
   a first memory section comprising a plurality of volatile memory cells;
   a second memory section comprising a plurality of nonvolatile memory cells;
   a first data path configured to transfer data between the first and second memory sections;
   an interface circuit coupled to receive access commands and address values for accessing at least the first memory section via a second data path that is narrower than the first data path; and
   a select circuit coupled between the first data path and the second data path and configured to connect a portion of the second data path to the first data path; wherein
   the second data path has a width of N bits, and the first data path has a width of N×M bits, where M is an integer greater than 3.

2. The system of claim 1, further including:
   a first access interface coupled between the first data path and the first memory section, and configured to provide access to the volatile memory cells; and
   a second access interface coupled between the first data path and the second memory section, and configured to provide access to the nonvolatile memory cells.

3. The system of claim 2, further including:
   first decoder circuits coupled between the first access interface and the first memory section, and configured to decode received address values to access particular volatile memory cells; and
   second decoder circuits coupled between the second access interface and the second memory section, and configured to decode received address values to access particular nonvolatile memory cells.

4. The system of claim 2, wherein the first access interface and second access interface access their respective memory cells at bit widths greater than 64-bits.

5. The system of claim 1, wherein the interface circuit is a serial interface circuit configured to transfer addresses and data in a serial fashion.

6. The system of claim 1, wherein the nonvolatile memory cells comprise CBRAM type memory cells.

7. A system, comprising:
   a first memory section comprising a plurality of volatile memory cells;
   a second memory section comprising a plurality of nonvolatile memory cells programmable to at least two different data retention times;
   a first data path configured to transfer data between the first and second memory sections;
   an interface circuit coupled to receive access commands and address values for accessing at least the first memory section, the interface circuit configured to generate a retention value in response to predetermined conditions; and
   a program circuit coupled to the second memory section configured to program nonvolatile memory cells to one of a plurality of different data retention times based on the retention value.

8. The system of claim 7, wherein:
   the predetermined conditions comprise at least one predetermined command input to the interface circuit.

9. The system of claim 7, wherein:
   the predetermined conditions comprise a wear value corresponding to a number of times at least a portion of the second memory section has been accessed.

10. The system of claim 7, wherein:
    the predetermined conditions comprise an alarm value indicating that a power supply of the system may be interrupted.

11. The system of claim 7, wherein:
    the program circuit is further configured to program nonvolatile memory cells to a longer data retention time after a predetermined amount of time has passed since the same nonvolatile memory cells were programmed to a shorter retention time.

12. The system of claim 7, wherein the nonvolatile memory cells comprise CBRAM type memory cells.

13. A system, comprising:
    a first memory section comprising a plurality of volatile memory cells;
    a second memory section comprising a plurality of nonvolatile memory cells;
    a first data path configured to transfer data between the first and second memory sections;
    an interface circuit coupled to receive access commands and address values for accessing at least the first memory section via a second data path that is narrower than the first data path;
    a select circuit coupled between the first data path and the second data path and configured to connect a portion of the second data path to the first data path;
    a first access interface coupled between the first data path and the first memory section, and configured to provide access to the volatile memory cells; and
    a second access interface coupled between the first data path and the second memory section, and configured to provide access to the nonvolatile memory cells; wherein
    the first access interface and second access interface access their respective memory cells at bit widths greater than 64-bits.

14. The system of claim 13, wherein the second data path has a width of N bits, and the first data path has a width of N×M bits, where M is an integer greater than 3.

15. The system of claim 13, further including:
first decoder circuits coupled between the first access interface and the first memory section, and configured to decode received address values to access particular volatile memory cells; and
second decoder circuits coupled between the second access interface and the second memory section, and configured to decode received address values to access particular nonvolatile memory cells.

16. The system of claim 13, wherein the interface circuit is a serial interface circuit configured to transfer addresses and data in a serial fashion.

17. The system of claim 13, wherein the nonvolatile memory cells comprise CBRAM type memory cells.

* * * * *